United States Patent
Zayets et al.

(10) Patent No.: US 8,270,198 B2
(45) Date of Patent: Sep. 18, 2012

(54) NONVOLATILE OPTICAL MEMORY ELEMENT, MEMORY DEVICE, AND READING METHOD THEREOF

(75) Inventors: Vadym Zayets, Ibaraki (JP); Koji Ando, Ibaraki (JP); Shinji Yuasa, Ibaraki (JP); Hidekazu Saito, Ibaraki (JP)

(73) Assignee: National Institute of Advanced Industrial Science and Technology (JP)

( * ) Notice: Subject to any disclaimer, the term of this patent is extended or adjusted under 35 U.S.C. 154(b) by 273 days.

(21) Appl. No.: 12/844,758

(22) Filed: Jul. 27, 2010

(65) Prior Publication Data

US 2011/0026296 A1 Feb. 3, 2011

(30) Foreign Application Priority Data

Jul. 30, 2009 (JP) ................................. 2009-177145

(51) Int. Cl.
*G11C 13/06* (2006.01)

(52) U.S. Cl. ........................................ 365/122; 365/158

(58) Field of Classification Search ................... 365/122, 365/158

See application file for complete search history.

(56) References Cited

U.S. PATENT DOCUMENTS

| 5,631,096 | A | * | 5/1997 | Nakajima et al. | ............. 428/819 |
| 5,740,117 | A |  | 4/1998 | Bona et al. |  |
| 5,999,284 | A |  | 12/1999 | Roberts |  |
| 6,647,163 | B2 |  | 11/2003 | Song |  |
| 6,937,434 | B2 | * | 8/2005 | Takahashi | ..................... 360/112 |
| 7,042,669 | B2 | * | 5/2006 | Ogawa et al. | ................... 360/55 |
| 7,171,096 | B2 |  | 1/2007 | Zayets |  |
| 2005/0013060 | A1 | * | 1/2005 | Grimm | ........................ 360/324 |
| 2006/0002037 | A1 |  | 1/2006 | Zayets |  |
| 2006/0186444 | A1 | * | 8/2006 | Nikonov et al. | .............. 257/295 |

OTHER PUBLICATIONS

Zaets and Ando, "Optical Waveguide Isolator Based on Nonreciprocal Loss/Gain of Amplifier Covered by Ferromagnetic Layer",1999, IEEE Photonics Technology Letters, vol. 11, No. 8, pp. 1012-1014 (1999).

Zayets and Ando, "Isolation effect in ferromagnetic-metal/semiconductor hybrid optical waveguide", American Institute of Physics, Applied Physics Letters 86, 261105, (2005).

Zayets and Ando, "High-speed switching of spin polarization for proposed spin-photon memory", American Institute of Physics, Applied Physics Letters 94, 121104, (2009).

* cited by examiner

*Primary Examiner* — Michael Tran
(74) *Attorney, Agent, or Firm* — Squire Sanders (US) LLP

(57) ABSTRACT

A nonvolatile optical memory element in which a ferromagnetic body is provided on a semiconductor causes such a problem that in a case where magnetization of the ferromagnetic body is read by light, magneto-optical response becomes very small when the ferromagnetic body is small in volume. The present invention provides a memory element, a memory device, and a data reading method, each of which is applicable to data reading from a nonvolatile optical memory element. In a nonvolatile optical memory element having a structure in which a ferromagnetic body is provided on a semiconductor that is connected to an optical waveguide, electrons are injected into the semiconductor via the ferromagnetic body so that the electrons that are spin-polarized according to a magnetization direction of the ferromagnetic body are injected into the semiconductor, thereby enlarging a region in which a photomagnetic effect occurs effectively. By applying an electric pulse and an optical pulse to the nonvolatile optical memory element, it is possible to effectively read recorded data according to a magnetization direction of the ferromagnetic body.

10 Claims, 7 Drawing Sheets

US 8,270,198 B2

NONVOLATILE OPTICAL MEMORY ELEMENT, MEMORY DEVICE, AND READING METHOD THEREOF

This Nonprovisional application claims priority under 35 U.S.C. §119(a) to Patent Application No. 2009-177145 filed in Japan on Jul. 30, 2009, the entire contents of which are hereby incorporated by reference.

TECHNICAL FIELD

This invention relates to a nonvolatile optical memory element, such as a spin-photon memory that uses spin injection, a method for reading data from the nonvolatile optical memory element, a memory device including the nonvolatile optical memory elements, and a method for reading data from the memory device.

Background Art

A high-speed nonvolatile optical memory is very important for optical networks. High-speed data processing such as a receiving, a storing and a resending of data are the main functions of an optical network server. At present, a buffer memory made of electronic components in combination with an opto-electronic converter is employed for these functions. The opto-electronic conversion limits the speed of data processing. For faster speed, a high-speed nonvolatile optical memory is required.

In Patent Literature 1, a method of storing optical signals in a loop structure is described. The method allows storing of a fixed amount of information within an optical loop. In Patent Literature 2 and Patent Literature 3, an optical memory device including a Mach-Zender interferometer and a semiconductor optical amplifier is disclosed. Major limitation for the fast operational speed of these devices is the electron intersubband lifetime, which is rather long in a semiconductor. Also, those memories are volatile; therefore they can store data only for rather short time interval. A high-speed nonvolatile optical memory element was disclosed in Patent Literature 4 (of the inventors of the present invention) (Patent Literature 5 in United States patent). A main advantage of this memory element is very fast operational speed.

The inventors proposed a memory device whose recording speed can be 1 TBit/sec or faster, in Non-patent Literature 1. FIG. 1 shows a principle of the memory device. The memory device has a structure in which micro-sized memory cells are integrated on a semiconductor wafer. A bit of data is stored in each of the memory cells. Each of the memory cells includes a semiconductor photodetector 2 and a nanomagnet 1 made of a ferromagnetic metal. A nanomagnet is a micro-size ferromagnetic body in a single domain (single-magnetic structure) state. The nanomagnet 1 has two stable magnetization directions. The data is stored as a magnetized direction in the nanomagnet 1. For data recording, the magnetized direction is reversed by an optical pulse. A circularly-polarized optical pulse is absorbed in the semiconductor photodetector 2 that creates spin-polarized electrons.

When a voltage is applied, these spin-polarized electrons are injected from the semiconductor photodetector into the nanomagnet 1. Spin transfer torque is a consequence of the transfer of spin angular momentum from a spin-polarized current to the magnetic moment of the nanomagnet 1. If the torque is sufficient, the magnetization turns and data is memorized. Since the high-speed switching of spin polarization by photons is a main advantage of this memory device, hereinafter the memory device will be named spin-photon memory. A magneto-optical effect in the nanomagnet can be used to read data stored in the spin-photon memory. In a case where the nanomagnet is placed near to an optical waveguide, the loss of light in the optical waveguide varies depending on which one of two opposite magnetization directions the nanomagnet is magnetized along (Non-patent Literatures 2 and 3). Therefore, the data stored in the memory can be read by measuring the intensity of output light.

CITATION LIST

Patent Literature 1
U.S. Pat. No. 5,740,117 (Registration Date: Apr. 14, 1998)
Patent Literature 2
U.S. Pat. No. 5,999,284 (Registration Date: Dec. 7, 1999)
Patent Literature 3
U.S. Pat. No. 6,647,163 (Registration Date: Nov. 11, 2003)
Patent Literature 4
Japanese Patent Application Publication, Tokukai, No. 2006-018964 A (Publication Date: Jan. 19, 2006)
Patent Literature 5
U.S. Pat. No. 7,171,096 (Registration Date: Jan. 30, 2003)
Non-patent Literature 1
V. Zayets and K. Ando, Applied Physics Letters, vol. 94, 121104 (2009).
Non-patent Literature 2
W. Zaets (Vadym Zayets) and K. Ando, IEEE Photonics Technol. Lett. vol. 11, 1012 (1999)
Non-patent Literature 3
V. Zayets and K. Ando, Applied Physics Letter, vol. 86, 261105 (2005)

SUMMARY OF INVENTION

Technical Problem

A memory element of FIG. 1 was made and its characteristics were examined. The following takes as an example an AlGaAs optical waveguide including a nanomagnet made of Fe with a size of 3 μm (micrometers)×8 μm or a size of 3 μm×4 μm such that the nanomagnet is embedded into the AlGaAs optical waveguide. In FIG. 2A and FIG. 2B, optical transmission in the AlGaAs optical waveguide into which the nanomagnet is embedded is represented as a function of a magnetic field that is applied in a direction perpendicular to a direction of light propagation. In the embedding structure, a nanomagnet is formed in such a manner that (i) a pit having a depth of 120 nm (nanometers) is wet etched inside a core layer of the AlGaAs rib optical waveguide, and (ii) Fe is vapor-deposited thereto so as to have a thickness of about 40 nm.

FIG. 2A shows a case where the size of the nanomagnet is 3 μm×8 μm, and FIG. 2B shows a case where the size of the nanomagnet is 3 μm×4 μm. In FIG. 2A and FIG. 2B, the size indicates (width)×(length) where the length is along the direction of light propagation and the width is along a direction perpendicular to the direction of light propagation. A laser with a wavelength of 870 nm was used for measurements. In FIG. 2A, N indicates noise and S indicates a magneto-optical signal. As shown in FIG. 2A and FIG. 2B, a clear hysteresis loop can be seen. That proves that optical loss in this waveguide is different for two opposite magnetization directions of the nanomagnet and that magnetization of the nanomagnet can be read by waveguiding light that has passed through the optical waveguide. Further, it is demonstrated that the smaller the size of the nanomagnet is, the more the amplitude of the loop is reduced.

FIG. 3A and FIG. 3B respectively show amplitude of a magneto-optical signal and values of a signal-to-noise ratio (SNR) each for different sizes of the nanomagnet. In both graphs of FIG. 3A and FIG. 3B, a lateral axis indicates the length of the nanomagnet (length of metal pillar) where the length is along the direction of light propagation in the memory element. The amplitude of the magneto-optical signal in the AlGaAs optical waveguide into which the nanomagnet is embedded is shown in FIG. 3A as a function of the length of the nanomagnet. The magneto-optical signal was detected by the method shown in FIG. 2A. The signal-to-noise ratio (SNR) in the AlGaAs optical waveguide into which the nanomagnet is embedded is shown in FIG. 3B as a function of the length of the nanomagnet.

As shown in FIG. 3A and FIG. 3B, intensity of the magneto-optical signal linearly decreases with reduction of the size of the nanomagnet. Further, the intensity of the magneto-optical signal and the SNR drastically decrease when the size of the nanomagnet substantially equals to a wavelength of the light. This is because the intensity of the magneto-optical signal is proportional to the volume of a magneto-optical material. The SNR of a long nanomagnet is about 10 dB. However, when the length of the nanomagnet becomes smaller than 1 µm, the SNR sharply decreases. The results show that the size of the nanomagnet should be larger than a few micrometers for reliable reading of the magnetization of the nanomagnet by waveguiding light that has passed through the optical waveguide.

However, there is a problem that recording data in the memory element requires the size of the nanomagnet to be not more than 0.2 µm. The high-speed data recording for the spin-photon memory is possible only in the case where the size of the nanomagnet does not exceed 200 nm×200 nm (Non-patent Literature 1). On the other hand, for stable data reading from the spin-photon memory, the SNR should be large. It could be concluded from experimental data shown in FIG. 3A and FIG. 3B, that it is difficult to obtain a high magneto-optical signal and a high SNR in the case where the size of the nanomagnet are not more than 200 nm.

An object of the present invention is to solve this problem and to read magnetization of a nanomagnet by waveguiding light, even in a case where the size of the nanomagnet is smaller than 200 nm. In order to read data from a spin-photon memory at high speed, it is necessary to read a magnetization direction of the nanomagnet with the use of the magneto-optical effect. However, since the size of the nanomagnet is very small, the magneto-optical effect of the nanomagnet becomes very small, thereby making it difficult to read the magnetization direction of the nanomagnet with a sufficient SNR value.

The present invention is accomplished in view of the above problem. An object of the present invention is to provide a nonvolatile optical memory element that allows effective reading of magnetization of a nanomagnet by light. Further, another object of the present invention is to provide a method for reading data stored in a spin-photon memory at high speed and with high reliability. Further another object of the present invention is to provide a memory device including a plurality of spin-photon memory elements and an effective method for reading data from the memory device at high speed.

Solution to Problem

The present invention provides (i) a nonvolatile optical memory element for reading a magnetization direction of a nano-sized magnet by use of light by performing spin injection into a semiconductor from a nanomagnet, which is a micro-sized ferromagnetic body in a single domain (single-magnetic structure) state, (ii) a method for reading data from the nonvolatile optical memory element, (iii) a memory device including the nonvolatile optical memory elements, and (iv) a method for reading data from the memory device.

In the present invention, electrons of one spin polarization are injected into a semiconductor via a nanomagnet. The number of injected electrons with spin along a magnetization direction of the nanomagnet is not equal to the number of injected electrons with spin along a direction opposite to the magnetization direction of the nanomagnet. Therefore, light passing through a semiconductor region experiences the magneto-optical effect. Further, since the spin-polarized electrons spread over the semiconductor region, a region in which the magneto-optical effect effectively occurs becomes large and a significant magneto-optical signal is caused.

In order to achieve the above-mentioned object, the present invention has the following features.

A nonvolatile optical memory element of the present invention includes an optical waveguide; a semiconductor amplification region that is connected to the optical waveguide; a ferromagnetic body having a single-magnetic structure, the ferromagnetic body being provided on one side of the semiconductor amplification region; and an electrode provided on another side of the semiconductor amplification region which side is opposite to the side of the semiconductor amplification region on which the ferromagnetic body is provided, such that the semiconductor amplification region is sandwiched between the electrode and the ferromagnetic body. In the nonvolatile optical memory element of the present invention, the semiconductor amplification region is caused to have a larger region where a photomagnetic effect more effectively occurs, when a voltage is applied between the electrode and the ferromagnetic body so that electrons that are spin-polarized according to a magnetization direction of the ferromagnetic body are injected from the ferromagnetic body into the semiconductor amplification region. A micro-sized ferromagnetic body in a single domain (single-magnetic structure) state is called a nanomagnet. The magnetization of the nanomagnet has two stable magnetization directions. In this invention, it is desirable that the size of the above-mentioned ferromagnetic body be 200 nm×200 nm or less.

A method of the present invention is a method for reading data stored in the nonvolatile optical memory element, and includes the steps of: applying an electrical pulse between the electrode and the ferromagnetic body; supplying an optical pulse into the semiconductor amplification region via the optical waveguide; and reading intensity of the optical pulse outputted at an output side of the nonvolatile optical memory element.

A memory device of the present invention includes: a plurality of the nonvolatile optical memory elements; an optical pulse source; and optical waveguides.

A method of the present invention is a method for reading data from a memory device including a plurality of the nonvolatile optical memory elements, an optical pulse source, and optical waveguides, and the method includes the steps of: applying an electrical pulse to all the plurality of the nonvolatile optical memory elements; supplying an optical pulse to all the plurality of the nonvolatile optical memory elements; and reading intensity of a consecutive optical pulse train.

ADVANTAGEOUS EFFECTS OF INVENTION

In the memory element of the present invention, light passing through a semiconductor region experiences the magneto-optical effect due to the injection of spin-polarized electrons into a semiconductor from a nanomagnet, which is a micro-sized ferromagnetic body in a single-magnetic structure (single domain). In addition, the effective magneto-optical region broadens due to the wide spreading of spin-polarized electrons in the semiconductor region. This yields an effect that a significant magneto-optical signal is generated. As a result, the effective magneto-optical region can be significantly enlarged comparing to conventional techniques. In the conventional techniques of reading a magneto-optical signal, it was impossible to detect an output from a nanomagnet having a size of 200 nm×200 nm or less. In contrast, with the use of the memory element of the present invention, by performing the spin injection from a nanomagnet into a semiconductor by applying an electrical pulse, the output of the magneto-optical signal can be increased, thereby allowing data reading. Moreover, a bigger magneto-optical signal can be obtained by enlarging an amplification region in the semiconductor. Further, the memory device of the present invention is arranged such that: a plurality of the memory elements of the present invention is provided, and optical waveguides connect the memory elements to an optical pulse source; optical path lengths of the optical waveguides are adjusted so that an optical pulse passes through the memory elements so that the memory elements outputs respective optical pulses having different delays; and the respective optical pulses are combined at an output side of the memory device. This allows high-speed data reading from the memory device of the present invention by means of a consecutive optical pulse train. Further, in the memory device of the present invention, an electrical pulse and an optical pulse are applied to the memory elements so that a magnetization direction of a nano-sized memory element can be read as intensity of the optical pulse train due to the magneto-optical effect. This allows higher-speed data reading with a high SN ratio.

BRIEF DESCRIPTION OF DRAWINGS

FIG. 1 is a view showing a conventional technique.

FIG. 2A shows optical transmission of an AlGaAs optical waveguide into which a nanomagnet having a size of 3 μm×8 μm is embedded, the optical transmission being shown as a function of a magnetic field applied perpendicularly to a light propagation direction.

FIG. 2B shows optical transmission of an AlGaAs optical waveguide into which a nanomagnet having a size of 3 μm×4 μm is embedded, the optical transmission being shown as a function of a magnetic field applied perpendicularly to a light propagation direction.

FIG. 3A shows a relationship between a length of a nanomagnet and a magneto-optical signal, showing the magneto-optical signal as a function of the length of the nanomagnet in a case of an AlGaAs optical waveguide into which the nanomagnet is embedded.

FIG. 3B shows a relationship between a length of a nanomagnet and a SNR (signal-to-noise ratio), showing the SNR as a function of the length of the nanomagnet.

FIG. 4A is a view showing an operation principal of the present invention, showing that in a case where electrons are spin-polarized upwardly in a conduction band, only left-handed circularly-polarized light is amplified.

FIG. 4B is a view showing an operation principal of the present invention, showing that in a case where electrons are spin-polarized downwardly in a conduction band, only right-handed circularly-polarized light is amplified.

FIG. 5 is a view showing a principle to read data from a nonvolatile optical memory element according to the first embodiment of the present invention.

FIG. 6 is a view showing a method for reading data from a memory device according to the second embodiment of the present invention.

FIG. 7 is a view showing Example 1 of the nonvolatile optical memory element of the present invention

FIG. 8 is a view showing Example 2 of the nonvolatile optical memory element of the present invention.

FIG. 9 is a view showing Example 3 of the nonvolatile optical memory element of the present invention.

DESCRIPTION OF EMBODIMENTS

As disclosed in the present invention, in order to increase magneto-optical response of a nanomagnet, electrons are injected from the nanomagnet into a semiconductor. The number of injected electrons with spin along a magnetization direction of the nanomagnet and the number of injected electrons with spin along a direction opposite to the magnetization direction are different. The difference in the number between these electrons causes a significant magneto-optical effect in the semiconductor. Moreover, the electrons spread into a large volume of the semiconductor, so that an effective volume of the magneto-optical effect increases significantly. Therefore, the magnetization of the nanomagnet can be detected with a high signal-to-noise ratio (SNR).

Figure 4A:
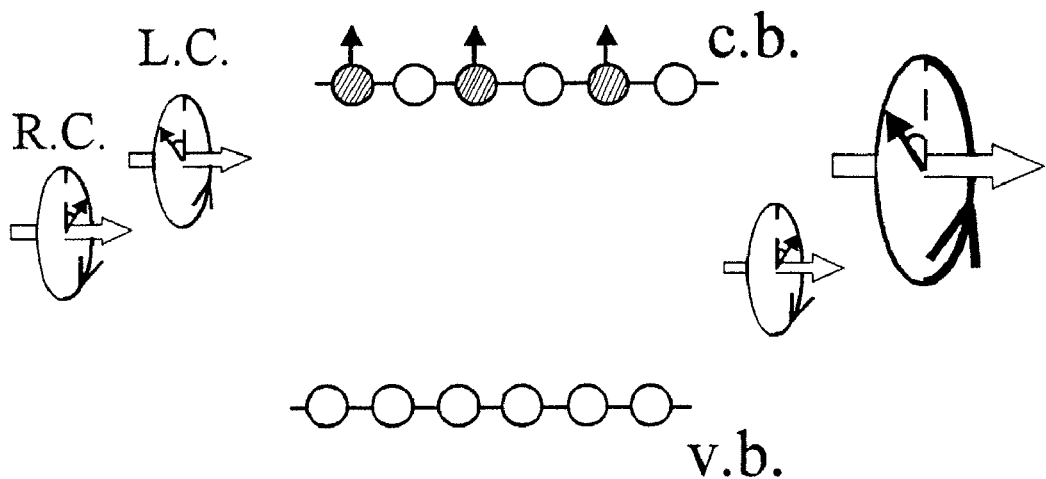
FIG. 4A
Figure 4B:
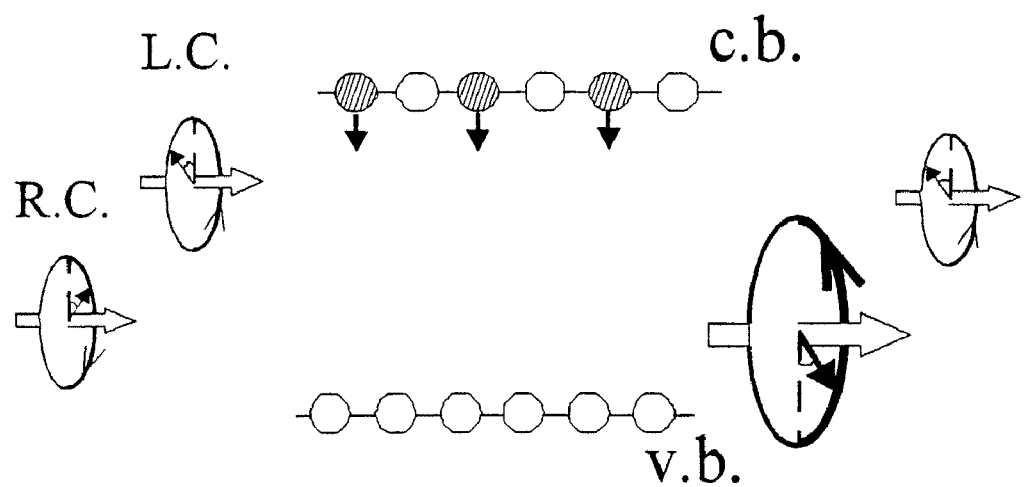
FIG. 4B

An operation principle of the present invention is described with reference to FIG. 4A and FIG. 4B. FIG. 4A and FIG. 4B are schematic views each showing the principle of how light is amplified by spin-polarized electrons in the semiconductor. In the figures, cb is a conduction band, vb is a valence band, LC indicates left-handed circularly-polarized light, and RC indicates right-handed circularly-polarized light. The left-handed circularly-polarized light is amplified only if there are spin-up electrons in the conduction band as it is shown in FIG. 4A. The right-handed circularly-polarized light is amplified only if there are spin-down electrons in the conduction band as it is shown in FIG. 4B. A region where light is amplified is called a semiconductor amplification region. Due to optical selection rule, when the spin-up electrons are injected into the semiconductor amplification region, only the left-handed circularly-polarized light is amplified. On the other hand, when the spin-down electrons are injected into the semiconductor amplification region, only the right-handed circularly-polarized light is amplified. When linearly polarized light is amplified by an optical amplifier into which the spin-polarized electrons are injected, a polarization plane of the linearly polarized light rotates. The following describes embodiments of the present invention.

(First Embodiment)

A nonvolatile optical memory element according to the first embodiment of the present invention includes an optical waveguide, a semiconductor amplification region, a nanomagnet, an electrode (electric contact), and an optical polarizer. The above-mentioned optical waveguide is constituted by a core region buried between two layers of a clad region. The refractive index of the core region is higher than the refractive index of the clad region. The semiconductor amplification region includes three layers: an n-type semiconductor, an undoped semiconductor, and a p-type semiconductor. The semiconductor amplification region is connected with the optical waveguide via which light comes in and out. A micro-sized ferromagnetic body in a state of a single domain (single-magnetic structure) is called a nanomagnet. An approximate size of the ferromagnetic body is not more than 200 nm×200 nm. Magnetization of the nanomagnet takes two stable magnetization directions along the direction of a magnetic easy axis. The nanomagnet is made of ferromagnetic metal and provided on an n-type semiconductor side of the semiconductor amplification region. The electrode is connected to a p-type semiconductor side of the semiconductor amplification region. The optical polarizer is located at an output side of the memory element.

Data is recorded in the memory element by means of the two opposite magnetization directions of the nanomagnet. When a voltage is applied between the nanomagnet and the electrode provided on the p-type semiconductor side, electrons are injected into the semiconductor amplification region, so that an optical gain can be obtained through the semiconductor amplification region.

An amount of the spin of the electrons injected from the nanomagnet into the semiconductor amplification region is not equal for the spin parallel to a magnetization direction of the nanomagnet and the spin unparallel to the magnetization direction of the nanomagnet. The optical gain of the semiconductor amplification region is different for the right-handed circularly-polarized light and the left-handed circularly-polarized light, because the amount of the spin parallel to the magnetization direction and the amount of the spin unparallel to the magnetization direction are different in the semiconductor amplification region. A polarization direction of linearly-polarized light rotates when the linearly-polarized light passes through the semiconductor amplification region. Thus, a rotation direction of the polarized light varies according to which direction of the two opposite magnetization directions the nanomagnet is magnetized along.

An optical axis of the optical polarizer is adjusted so that, at the output side of the memory element, light is completely blocked in a certain magnetization direction of the nanomagnet, and light is not blocked or only partially blocked in a magnetization direction of the nanomagnet, which is opposite to the certain magnetization direction.

Figure 5:
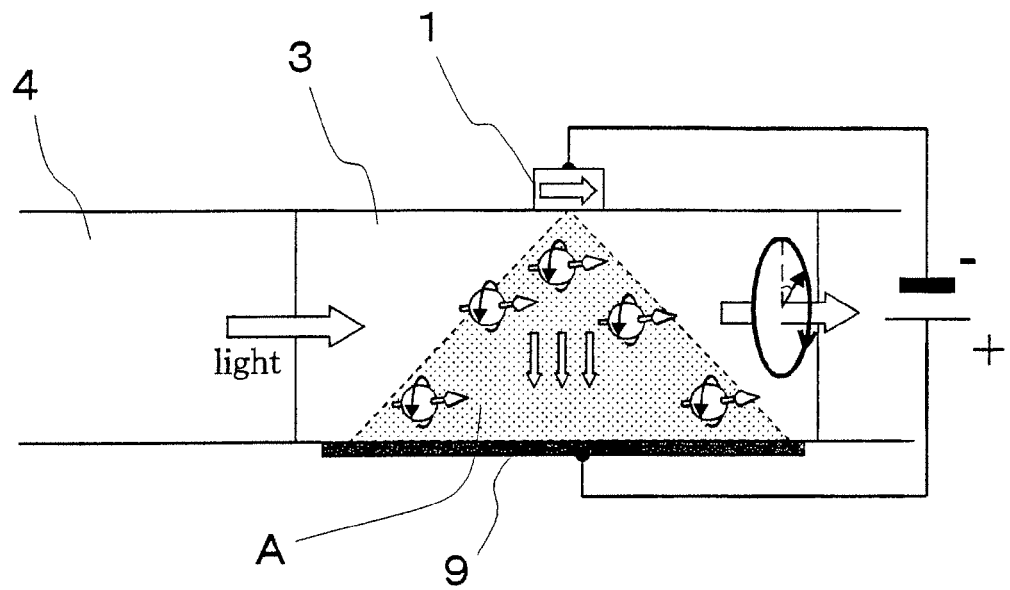
FIG. 5

The first embodiment of the present invention is more specifically described below with reference to FIG. 5. FIG. 5 shows a basic arrangement of reading data from the memory element of the present invention. A spin-photon memory, which is the nonvolatile optical memory element of the present invention, includes: an optical waveguide 4; a semiconductor optical amplifier 3, to which light enters via the optical waveguide 4; a nanomagnet 1 provided on one side of the semiconductor optical amplifier 3; and an electrode 9 provided on another side of the semiconductor optical amplifier 3. A size of the nanomagnet is 200 nm×200 nm or less. The nanomagnet has a layer thickness of preferably not more than 10 nm. For example, the nanomagnet has a size of 100 nm×100 nm and a thickness of 5 nm. A voltage source is connected between the nanomagnet 1 and the electrode 9. When a voltage is applied, spin-polarized electrons with the spin along a magnetization direction of the nanomagnet are injected into the semiconductor optical amplifier 3 from the nanomagnet 1. A downward outline arrow in FIG. 5 schematically indicates a flow of electrons. The spin-polarized electrons injected into the semiconductor optical amplifier 3 from the nanomagnet 1 spread over a wide volume in the semiconductor optical amplifier, which is significantly larger than the volume of the nanomagnet. In FIG. 5, a region A shown by dots is an amplification region over which the spin-polarized electrons are spread. The region A is widened from the nanomagnet 1 toward the electrode 9. Further, the region A is a region in which the photomagnetic effect is effective. On this account, an effective magneto-optical signal occurring due to the spin injection is very significant as compared to a case where the light causes magneto-optical interaction with the nanomagnet. That is, the light is amplified by the semiconductor optical amplifier into which the spin-polarized electrons have been injected, and therefore a polarization plane of the light rotates. The direction of the rotation is different according to which direction the nanomagnet 1 is magnetized.

The following describes the spin injection in the present embodiment. In general, when electrons are injected from a ferromagnetic body into a semiconductor, the injected electrons are not spin-polarized in the semiconductor. This is caused due to conductivity mismatch between the ferromagnetic metal and the semiconductor. However, effective spin injection can be achieved when there is a tunnel barrier between the ferromagnetic metal and the semiconductor. For instance, an electric contact between the n-type semiconductor (the one like in the present embodiment) and transition metal (Fe, Co, FeCoB) is a Schottky type, and the tunnel barrier is naturally formed between the n-type semiconductor and the transition metal. In order to have effective spin injection, the thickness of the tunnel barrier should be properly optimized. In an actual element, the width of the Schottky barrier, which functions as the tunnel barrier, is influenced by several parameters, for example, materials of the transition metal and the semiconductor, the size of the nanomagnet, a doping profile of the semiconductor, and the size and structure of the amplification region. For instance, effective spin injection becomes possible by properly adjusting the doping profile near the nanomagnet and the size and structure of the amplification region. Thus, it is desirable to optimize the structure in order to efficiently inject, into the semiconductor, electrons that are spin-polarized in one direction. If one of the parameters is changed, the state of the optimized structure may be changed, so that both of the spin-up electrons and the spin-down electrons may be injected. In this case, the other parameters may be adjusted so as to optimize the structure.

A method for reading data stored in the nonvolatile optical memory element of the present invention includes the steps of: applying a short electrical pulse between the nanomagnet and the electrode provided on the p-type semiconductor side of the semiconductor optical amplifier; supplying a short optical pulse into the semiconductor amplification region via the optical waveguide; and reading intensity of an optical pulse outputted at an output side of the memory element. Timings of the short electrical pulse and the short optical pulse are adjusted so that the timing of the short optical pulse delays a little from the timing of the short electrical pulse and the delay is shorter than a relaxation time of spin polarization in the semiconductor amplification region. The polarization of the short optical pulse rotates in the above-mentioned semiconductor amplification region as explained previously. The rotation direction of the polarization corresponds to a magnetization direction of the nanomagnet. After the short optical pulse passes through the optical polarizer, intensity of light (the optical pulse) outputted at the output side of the memory element corresponds to the magnetization direction of the nanomagnet. The reason is as follows: Light is blocked by the optical polarizer in the case where the nanomagnet is magnetized along a certain magnetization direction, while light passes through the optical polarizer in the case where the nanomagnet is magnetized along another magnetization direction opposite to the above magnetization direction. Therefore, the intensity of the light (the optical pulse) outputted at the output side of the memory element corresponds to data stored or memorized in the memory element.

(Second Embodiment)

The second embodiment relates to a memory device constituted by a plurality of nonvolatile optical memory elements explained in the first embodiment. The memory device of the second embodiment includes a plurality of nonvolatile optical memory elements, a short optical pulse source, and optical waveguides. The optical waveguides connect the respective nonvolatile optical memory elements to the short optical pulse source, and the optical waveguides are combined at an output side of the memory device. The lengths of the optical waveguides are adjusted so that one optical pulse, after passing through different memory element cells, reaches the output side with different optical delays.

A method for reading data stored in the memory device of the second embodiment includes the steps of: applying a short electrical pulse to all the memory elements; supplying a short optical pulse to all the memory elements; and detecting intensity of a consecutive optical pulse train. The intensity of each optical pulse in the optical pulse train corresponds to data stored in a corresponding memory element. Light from a laser passes through independent optical paths of the respective memory elements. Therefore, an optical pulse from the laser is divided into a plurality of optical pulses. Each of the plurality of optical pulses passes through a corresponding memory element. Then, all the optical pulses are combined at the output side of the memory device. The respective optical paths have different lengths so that the respective optical pulses passing through the respective optical paths reach the output side at different timings. The intensity of each of the optical pulses corresponds to data stored in a corresponding memory element. Therefore, data stored in each of the memory elements can be read by measuring the intensity of the consecutive optical pulse train at the output side of the memory device.

Figure 6:
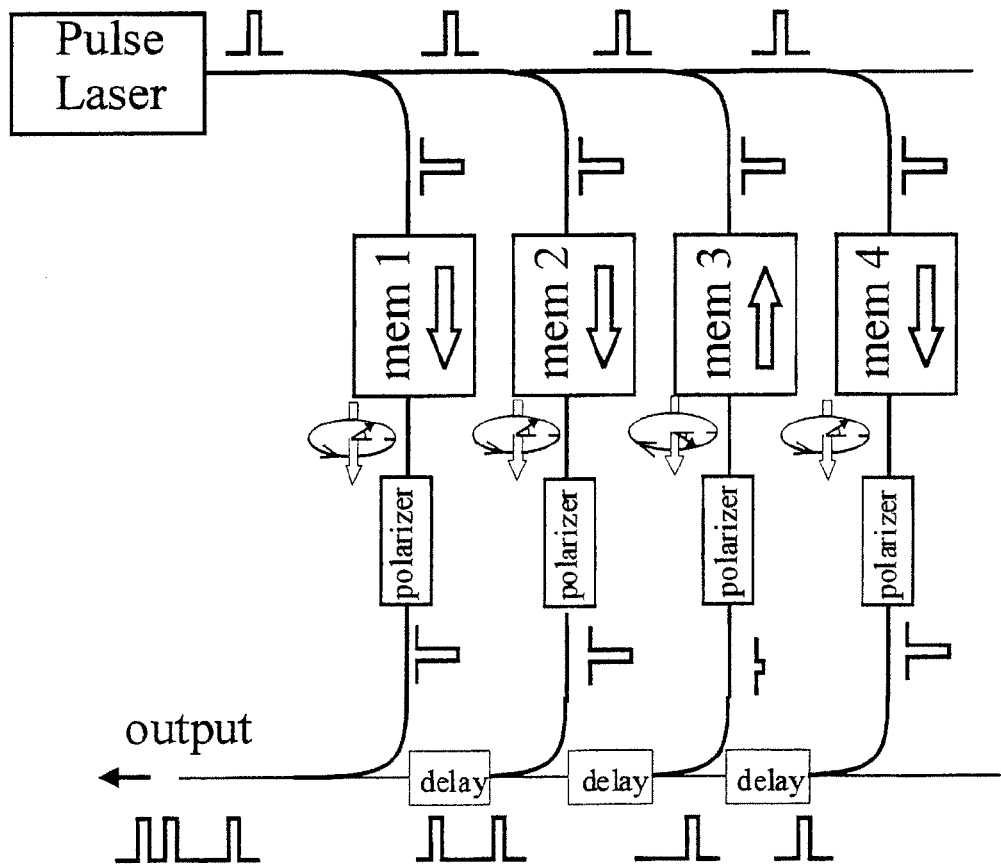
FIG. 6

With reference to FIG. 6, the second embodiment is described below more specifically. FIG. 6 is a view schematically showing a structure of reading data from a memory device constituted by several memory elements. One short pulse from the laser is divided into several pulses. Then, each of the pulses passes through a corresponding memory element (mem 1, mem2, mem3, mem4). Each of the pulses thus divided is initially linearly polarized. The polarization of each of the pulses rotates when the each of the pulses passes through its corresponding memory element. The direction of the rotation depends on data recorded in the corresponding memory element. After passing through the corresponding memory element, the each of the pulses passes through its corresponding polarizer. An axis of the polarizer is adjusted so that a pulse may pass through the polarizer when the polarization thereof rotates anti-clockwise, while a pulse is blocked when the polarization thereof rotates clockwise. All these pulses are then combined at the output side of the memory device. The pulses, which have passed through respective memory elements, have different delay times. Therefore, a pulse train of these pulses is formed at the output side. Amplitude of each of the pulses in the pulse train corresponds to data being recorded in a corresponding memory element of the memory device. In FIG. 6, only 4 memory elements (mem1 through mem4) are provided. However, the number of memory elements of the memory device is not especially limited. The number of memory elements is preferably 100 to 1000.

EXAMPLE 1

Figure 7:
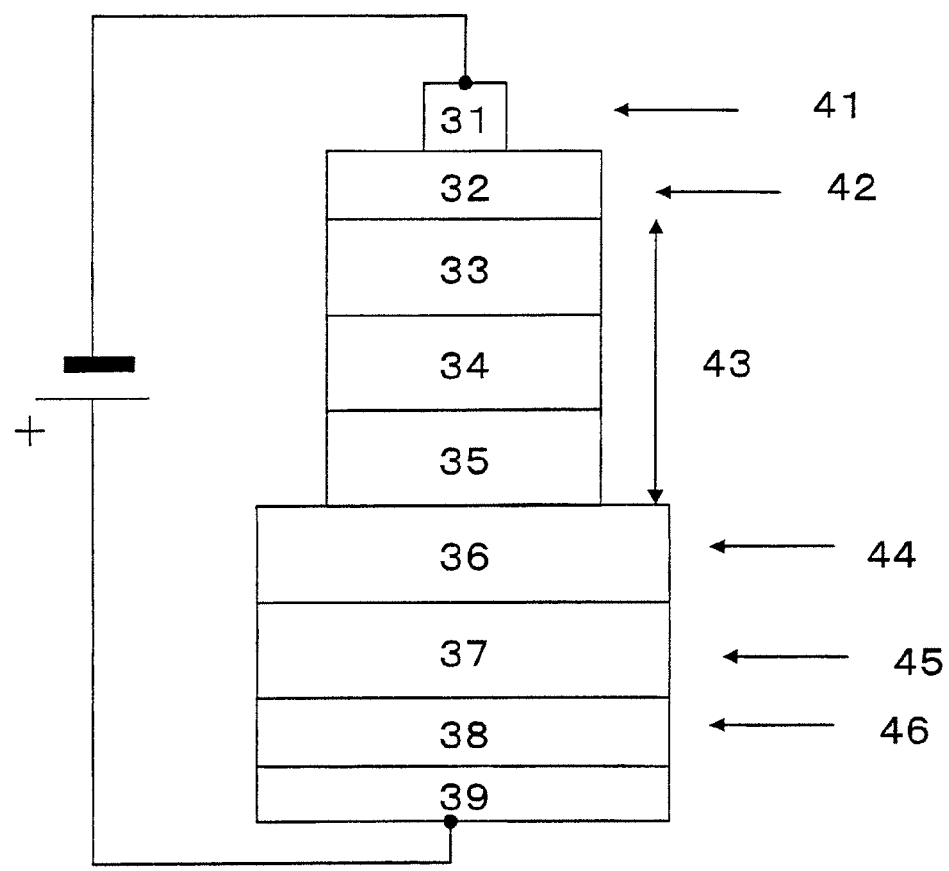
FIG. 7

FIG. 7 shows a structural example of the nonvolatile optical memory element used in the first and second embodiments. A spin-photon memory in Example 1 includes a substrate 46, an optical waveguide buffer layer 45, a waveguide core layer 44, a p-i-n semiconductor detector 43, which functions as a semiconductor optical amplifier, a buffer layer 42, and a nanomagnet 41. These members are stacked in this order. The substrate 46 is made of a p-type GaAs 38, and on one side of the substrate 46 is disposed a Cr/Au electrode 39. On another side of the substrate 46 which is opposite to the side of the substrate 46 on which the electrode 39 is disposed, the optical waveguide buffer layer 45 made of a p-type Al0.5Ga0.5As 37 and the optical waveguide core layer 44 made of a p-type Al0.3Ga0.7As 36 are provided. The p-i-n semiconductor detector 43, which functions as a semiconductor optical amplifier, is constituted by a p-type GaAs 35, an i-type GaAs 34, and an n-type GaAs 33. The nanomagnet 41, which is constituted by a Fe layer 31 made of ferromagnetic metal, is provided, via the buffer layer 42 made of an nn-type GaAs 32 to form an interface, above the p-i-n semiconductor detector 43, which functions as a semiconductor optical amplifier. A voltage source is connected between the Fe layer 31 of the nanomagnet 41 and the electrode 39.

Light incident into the optical waveguide core layer 44 is diffused and amplified in the p-i-n semiconductor detector 43, which functions as a semiconductor optical amplifier. More specifically, when spin-up electrons are injected from the nanomagnet 41 into the p-i-n semiconductor detector 43, only left-handed circularly-polarized light is amplified in the p-i-n semiconductor detector 43. Meanwhile, when spin-down electros are injected from the nanomagnet 41 into the p-i-n semiconductor detector 43, only right-handed circularly-polarized light is amplified in the p-i-n semiconductor detector 43. Further, when linearly-polarized light is amplified in the p-i-n semiconductor detector 43 into which spin-polarized electrons have been injected, a polarization plane of the linearly-polarized light rotates. Thus, the p-i-n semiconductor detector 43 serves as the optical amplifier 3 shown in FIG. 5. Further, in the p-i-n semiconductor detector 43, a region in which the spin-polarized electrons spread, i.e., a region in which the photomagnetic effect is effective (in other words, a region in which the magneto-optical effect is effective) corresponds to the region A shown in FIG. 5.

EXAMPLE 2

Figure 8:
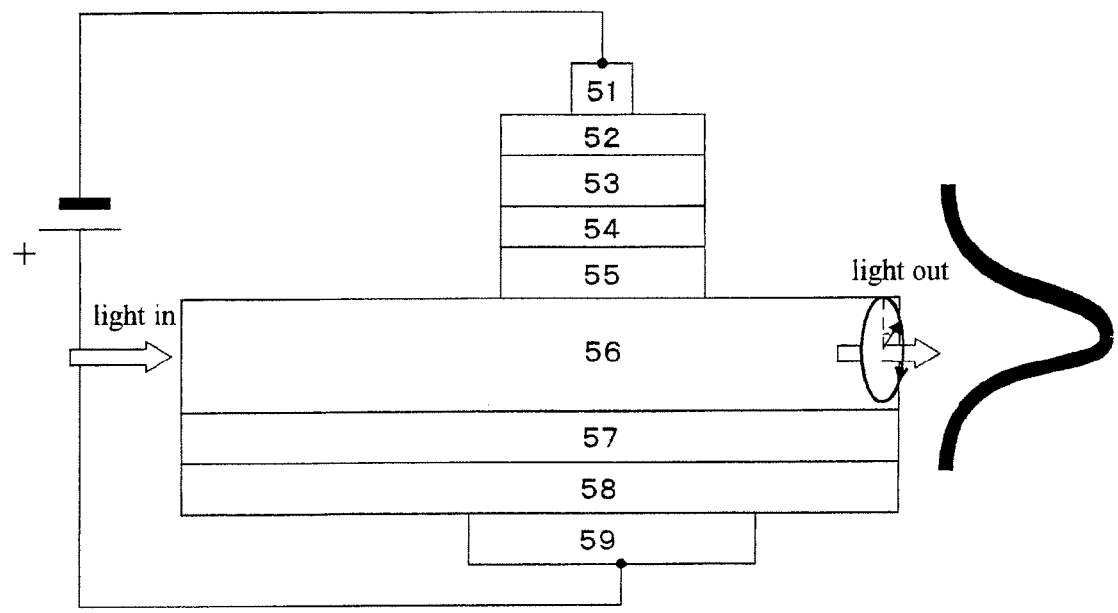
FIG. 8

Example 2 is a structural example in which a photodetector, which functions as an optical amplifier, is disposed on an optical waveguide. FIG. 8 shows the structure. An optical waveguide structure is constituted by a p-type GaAs 58, a p-type Al0.5Ga0.5As 57, and a p-type Al0.3Ga0.7As optical waveguide core 56. On one side of the optical waveguide structure is provided an electrode 59 made of Cr/Au. On another side of the optical waveguide structure are provided a p-type GaAs 55, an i-type GaAs 54, and an n-type GaAs 53, which are sequentially provided on the optical waveguide core, so as to constitute a p-i-n semiconductor detector, which functions as an optical amplifier. A buffer layer made of an nn-type GaAs 52 is provided on a top of the p-i-n semiconductor detector, and a Fe layer 51 is provided on a top of the nn-type GaAs 52. A voltage source is connected between the Fe layer 51, which serves as a nanomagnet, and the electrode 59. As shown in FIG. 8, when light is incident into the optical waveguide, the light is affected by the amplification effect, as explained in the principles of FIG. 4A, FIG. 4B, and FIG. 5, so that the light that is amplified and polarized according to a magnetization direction of the nanomagnet is outputted. In FIG. 8, a waveguide mode of the optical waveguide is shown on the right side of FIG. 8.

As such, light incident into the optical waveguide core 56 is diffused and amplified in the p-i-n semiconductor detector constituted by the p-type GaAs 55, the i-type GaAs 54, and the n-type GaAs 53. More specifically, when spin-up electrons are injected from the Fe layer 51, serving as a nanomagnet, into the p-i-n semiconductor detector, only left-handed circularly-polarized light is amplified in the p-i-n semiconductor detector. Meanwhile, when spin-down electros are injected from the Fe layer 51, serving as a nanomagnet, into the p-i-n semiconductor detector, only right-handed circularly-polarized light is amplified in the p-i-n semiconductor detector. Further, when linearly-polarized light is amplified in the p-i-n semiconductor detector into which spin-polarized electrons have been injected, a polarization plane of the linearly-polarized light rotates.

Thus, the p-i-n semiconductor detector constituted by the p-type GaAs 55, the i-type GaAs 54, and the n-type GaAs 53 serves as the optical amplifier 3 shown in FIG. 5. Further, in the p-i-n semiconductor detector, a region in which the spin-polarized electrons spread, i.e., a region in which the photo-magnetic effect is effective (in other words, a region in which the magneto-optical effect is effective) corresponds to the region A shown in FIG. 5.

EXAMPLE 3

Figure 9:
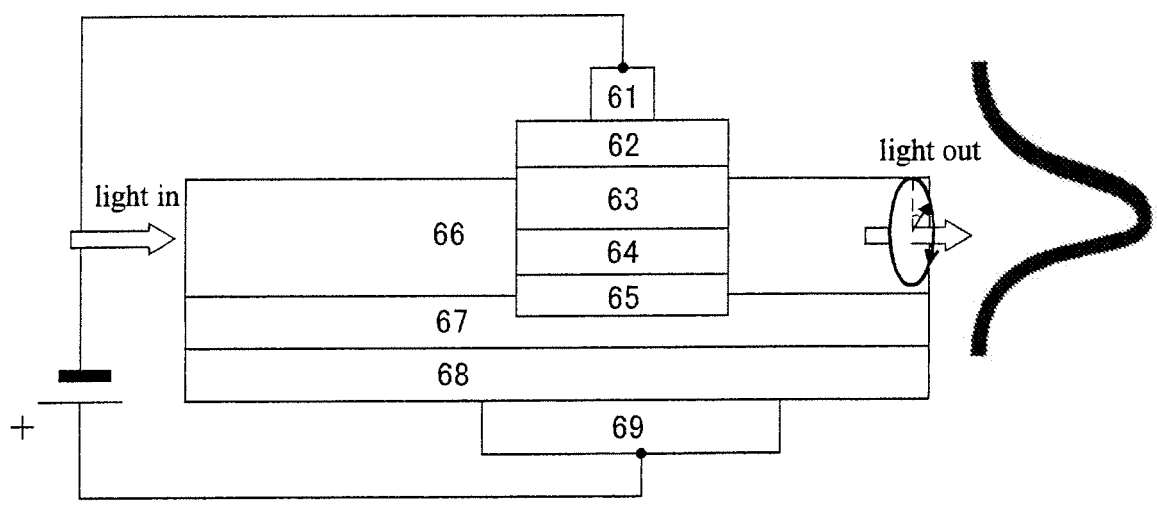
FIG. 9

Example 3 is a structural example of an optical waveguide into which a photodetector, which functions as an optical amplifier, is embedded. FIG. 9 shows the structure. An optical waveguide structure is constituted by a p-type GaAs 68, a p-type Al0.5Ga0.5As 67, and an i-type Al0.3Ga0.7As optical waveguide core 66. On one side of the optical waveguide structure is provided an electrode 69 made of Cr/Au. On another side of the optical waveguide structure, a groove is formed from a top surface of the optical waveguide core so that a p-type GaAs 65, an i-type GaAs 64, and an n-type GaAs 63 are sequentially provided in the groove, so as to constitute a p-i-n semiconductor detector, which functions as an optical amplifier. A buffer layer made of an nn-type GaAs 62 is provided on a top of the p-i-n semiconductor detector, and a Fe layer 61 is provided on a top of the nn-type GaAs 62. A voltage source is connected between the Fe layer 61, which serves as a nanomagnet, and the electrode 69. As shown in FIG. 9, when light is incident into the optical waveguide, the light is affected by the amplification effect, as explained in the principles of FIG. 4A, FIG. 4B, and FIG. 5, so that the light that is amplified and polarized according to a magnetization direction of the nanomagnet is outputted. In FIG. 9, a waveguide mode of the optical waveguide is shown on the right side of FIG. 9.

As such, light incident into the optical waveguide core 66 is amplified in the p-i-n semiconductor detector constituted by the p-type GaAs 65, the i-type GaAs 64, and the n-type GaAs 63. More specifically, when spin-up electrons are injected from the Fe layer 61, serving as a nanomagnet, into the p-i-n semiconductor detector, only left-handed circularly-polarized light is amplified in the p-i-n semiconductor detector. Meanwhile, when spin-down electros are injected from the Fe layer 61, serving as a nanomagnet, into the p-i-n semiconductor detector, only right-handed circularly-polarized light is amplified in the p-i-n semiconductor detector. Further, when linearly-polarized light is amplified in the p-i-n semiconductor detector into which spin-polarized electrons have been injected, a polarization plane of the linearly-polarized light rotates.

Thus, the p-i-n semiconductor detector constituted by the p-type GaAs 65, the i-type GaAs 64, and the n-type GaAs 63 serves as the optical amplifier 3 shown in FIG. 5. Further, in the p-i-n semiconductor detector, a region in which the spin-polarized electrons spread, i.e., a region in which the photo-magnetic effect is effective (in other words, a region in which the magneto-optical effect is effective) corresponds to the region A shown in FIG. 5.

In a case of the structure of Example 3 in which the p-i-n semiconductor detector, which serves as a semiconductor optical amplifier, is embedded into the optical waveguide, since the i-type semiconductor that mainly contributes to the amplification effect especially works effectively so that the amplification effect of the memory device in Example 3 is great as compared with the memory device in Example 2. On the other hand, Example 2 has an advantage that production of the memory device is much simple as compared with Example 3.

The chemical composition and the structure of Examples 1, 2, and 3 are only the illustrations. It is natural to use other materials, and Si etc. can be used for the semiconductor. Moreover, other materials, besides Fe, that are known as the ferromagnetic metal can be used as the ferromagnetic metal of the nanomagnet. For example, Co, FeCo, FeCoB, CoPt, FePt, and FeCuPt, etc. can be used.

Any of the nonvolatile optical memory elements of Examples 1 through 3 can be employed in the first and second embodiment.

The purpose of the above-shown examples is only to make the present invention easy to understand. The present invention is not limited only to the structure and materials shown in Examples 1 through 3.

<Detailed Description of FIG. 1 Through FIG. 6>

(FIG. 1)

Figure 1:
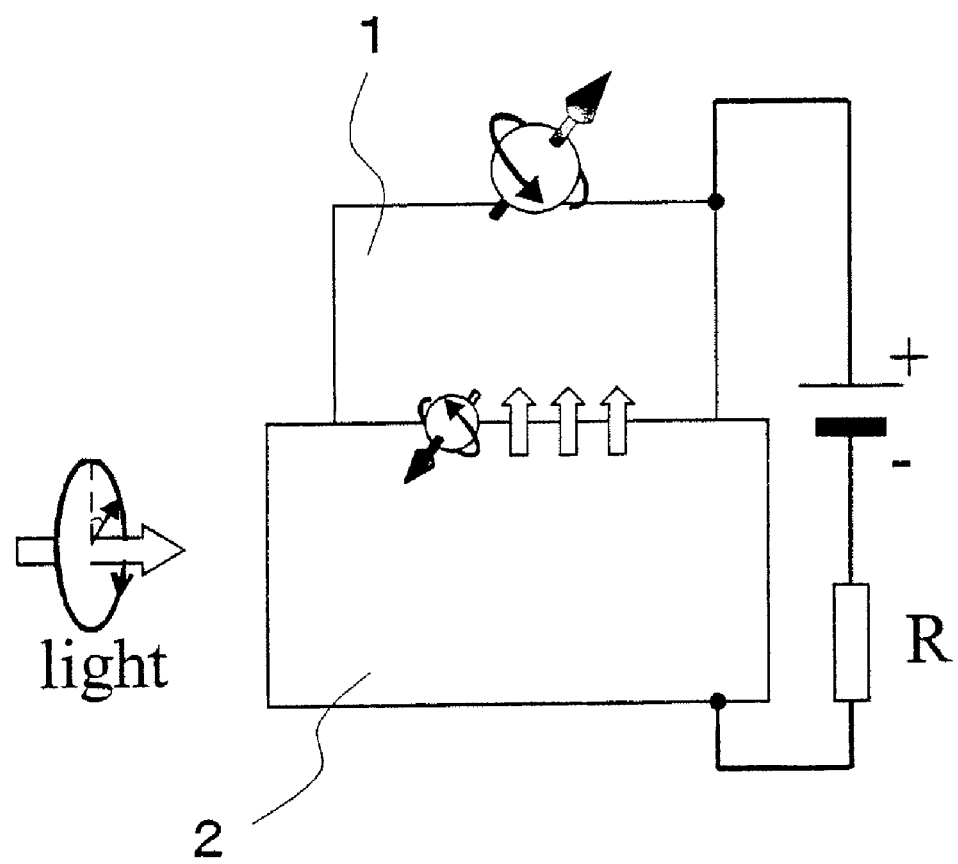
FIG. 1

FIG. 1 is a schematic view showing an optical memory element disclosed in Japanese Patent Application Publication, Tokukai, No. 2006-018964 A (U.S. Pat. No. 7,171,096). The optical memory element disclosed here is constituted by a semiconductor photodetector and a nanomagnet made of ferromagnetic metal. The nanomagnet has two stable magnetization directions. Data is stored as a magnetization direction of the nanomagnet. For data recording, the magnetization direction must be reversed by an optical pulse. A circularly-polarized optical pulse is absorbed in the semiconductor photodetector that creates spin-polarized electrons. When a voltage is applied, these spin-polarized electrons are injected from the semiconductor photodetector into the nanomagnet. Spin transfer torque is a consequence of the transfer of spin angular momentum from a spin-polarized current to the magnetic moment of the nanomagnet. If the torque is sufficient, the magnetization turns and data is memorized.

Figure 2A:
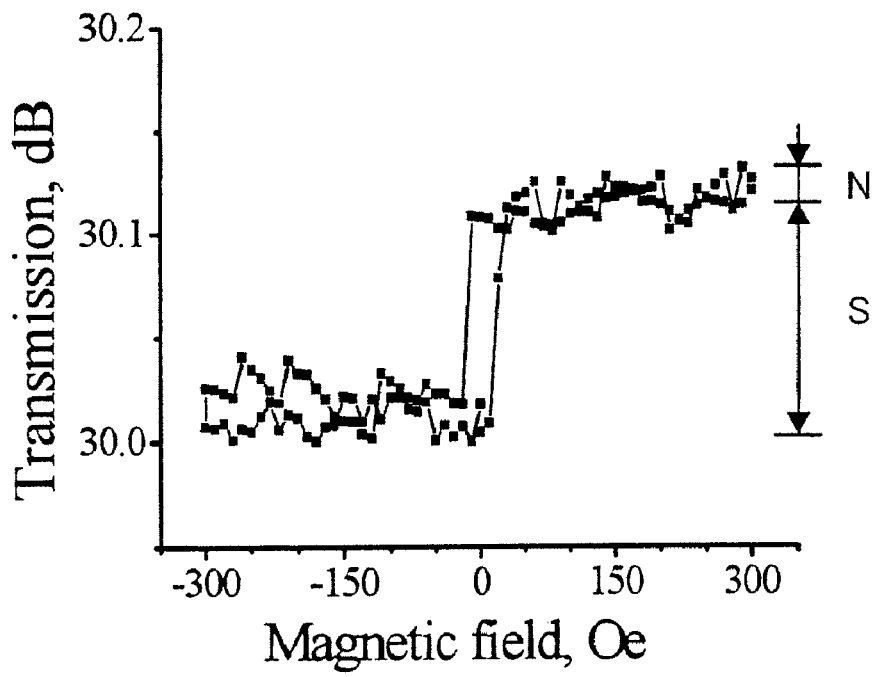
FIG. 2A
Figure 2B:
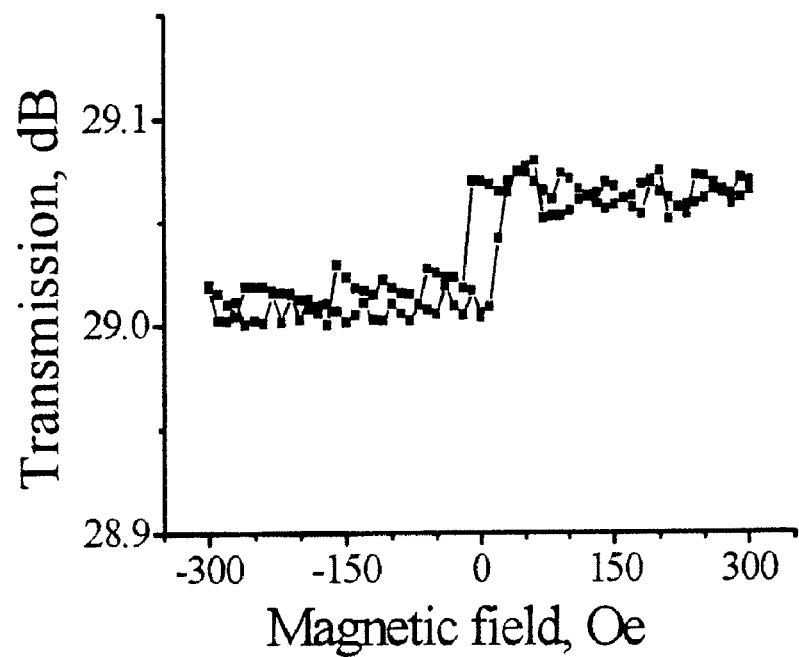
FIG. 2B

(FIG. 2A and FIG. 2B)

In FIG. 2A and FIG. 2B, optical transmission in an AlGaAs optical waveguide into which a nanomagnet is embedded is represented as a function of a magnetic field that is applied in a direction perpendicular to a direction of light propagation. The nanomagnet is formed in such a manner that (i) a pit having a depth of 120 nm is wet etched inside a core layer of the AlGaAs rib optical waveguide, and (ii) Fe is vapor-deposited thereto so as to have a thickness of about 40 nm. Since light absorption by the nanomagnet depends on magnetization of the nanomagnet, the optical transmission of this optical waveguide depends on a magnetization direction of the nanomagnet. FIG. 2A and FIG. 2B each shows experimentally measured optical transmission. FIG. 2A shows a case where the size of the nanomagnet is 3 µm×8 µm, and FIG. 2B shows a case where the size of the nanomagnet is 3 µm×4 µm. In both cases, the hysteresis loop is clear. Further, amplitude of the loop decreases when the size of the nanomagnet decreases.

Figure 3A:
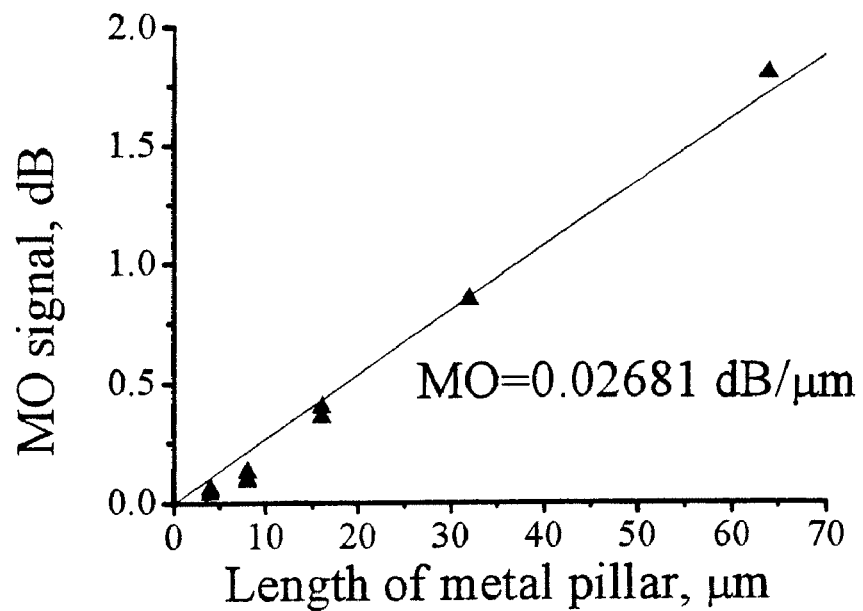
FIG. 3A
Figure 3B:
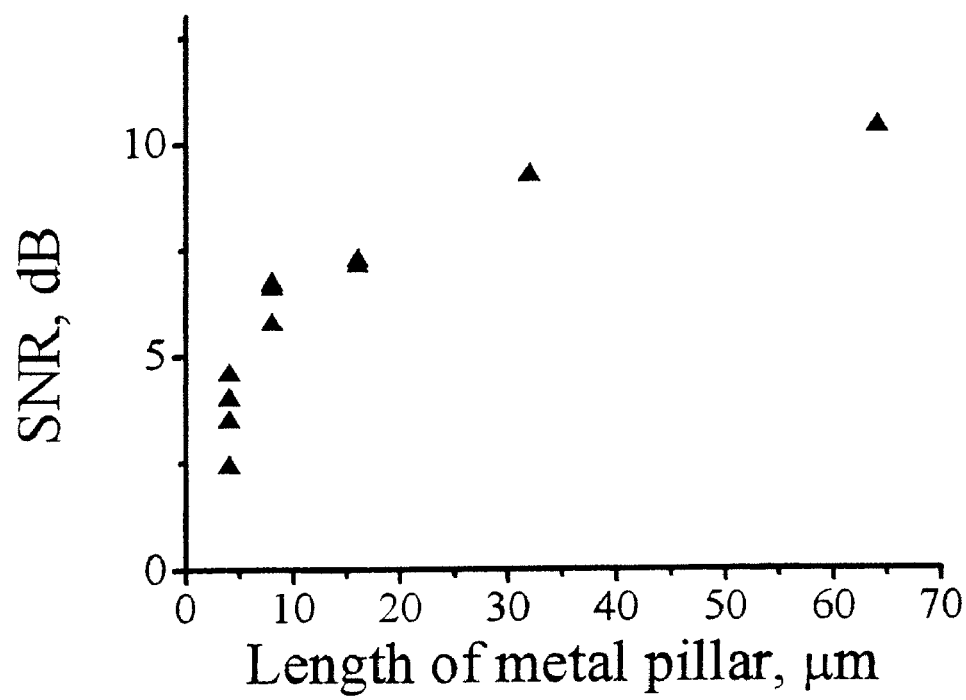
FIG. 3B

(FIG. 3A and FIG. 3B)

FIG. 3A shows a magneto-optical signal as a function of a length of a nanomagnet in a case of an AlGaAs optical waveguide into which the nanomagnet is embedded. The magneto-optical signal is measured as it is shown in FIG. 2A. FIG. 3B shows a signal-to-noise ratio (SNR) as a function of a length of a nanomagnet in a case of an AlGaAs optical waveguide into which the nanomagnet is embedded. The magneto-optical signal decreases linearly as the length of the nanomagnet decreases. This is because the magneto-optical signal is proportional to the volume of a magneto-optical material. The signal-to-noise ratio (SNR) is about 10 dB for long nanomagnets, but significantly decreases when the length of the nanomagnet is below 1 µm. These experimental results indicate that for effective reading of magnetization of a nanomagnet by waveguiding light, the size of the nanomagnet should be larger than a few micrometers. However, recording data into a memory element is only possible when the size of the nanomagnet is smaller than 0.2 µm. The present invention solves this problem by enlargement of effective magneto-optical volume by performing spin injection from a nanomagnet into a semiconductor optical amplifier.

(FIG. 4A and FIG. 4B)

FIG. 4A and FIG. 4B are schematic views each showing the principle of how light is amplified by spin-polarized electrons in a semiconductor. In the figures, cb is a conduction band, vb is a valence band, LC indicates left-handed circularly-polarized light, and RC indicates right-handed circularly-polarized light. Due to optical selection rule, only the left-handed circularly-polarized light is amplified when spin-up electrons are injected into a semiconductor amplification region. Meanwhile, when spin-down electrons are injected into the semiconductor amplification region, only the right-handed circularly-polarized light is amplified. When linearly polarized light is amplified by an optical amplifier into which spin-polarized electrons are injected, a polarization plane of the linearly polarized light rotates.

(FIG. 5)

FIG. 5 is a schematic view showing an arrangement for reading data from a memory element of the present invention. Spin-polarized electrons injected from a nanomagnet into an optical amplifier are spreading over volume of the optical amplifier (semiconductor optical amplifier), which is significantly larger than volume of the nanomagnet. Therefore, an effective magneto-optical signal due to spin injection becomes significantly large as compared with a case where light causes magneto-optical interaction with the nanomagnet. When light is amplified in the semiconductor optical amplifier in which the spin-polarized electrons have been injected, a polarization plane of the light rotates. The direction of the rotation varies depending on which direction the nanomagnet is magnetized along.

(FIG. 6)

FIG. 6 is a schematic view showing an arrangement for reading data from a memory device, which includes several memory element cells. A pulse laser provides a short pulse, which is split into several pulses so that each of the pulses passes through a corresponding memory element cell. Initial polarization of each of the pulses is linear. The polarization of each of the pulses rotates when the each of the pulses passes through its corresponding memory element cell. The direction of the rotation depends on data stored in the corresponding memory element cell. After passing through the corresponding memory element cell, the each of the pulses passes through its corresponding polarizer. An axis of the polarizer is adjusted so that a pulse may pass through the polarizer when the polarization thereof rotates anti-clockwise, while the pulse is blocked by the polarizer when the polarization thereof rotates clockwise. All these pulses are then combined at an output side of the memory device. The pulses, which have passed through respective memory element cells, have different delay times. Therefore, a pulse train of these pulses is formed at the output side. Amplitude of each of the pulses corresponds to data stored in a corresponding memory element cell.

<Overview>

As described above, the present invention provides (i) a nonvolatile optical memory element that reads a magnetization direction of a nano-sized magnet by use of light by performing spin injection into a semiconductor from a nanomagnet, which is a micro-sized ferromagnetic body in a single domain (single-magnetic structure) state, (ii) a method for reading data from the nonvolatile optical memory element, (iii) a memory device including the nonvolatile optical memory elements, and (iv) a method for reading data from the memory device.

In the present invention, electrons of one spin polarization are injected into a semiconductor via a nanomagnet. The number of injected electrons with spin along a magnetization direction of the nanomagnet is not equal to the number of injected electrons with spin along a direction opposite to the magnetization direction of the nanomagnet. Therefore, light passing through a semiconductor region experiences the magneto-optical effect. Further, since the spin-polarized electrons spread over the semiconductor region, a region in which the magneto-optical effect effectively occurs becomes large and a significant magneto-optical signal is generated.

In order to achieve the above-mentioned object, the present invention has the following features.

A nonvolatile optical memory element of the present invention includes an optical waveguide; a semiconductor amplification region that is connected to the optical waveguide; a ferromagnetic body having a single-magnetic structure, the ferromagnetic body being provided on one side of the semiconductor amplification region; and an electrode provided on another side of the semiconductor amplification region which side is opposite to the side of the semiconductor amplification region on which the ferromagnetic body is provided, such that the semiconductor amplification region is sandwiched between the electrode and the ferromagnetic body. In the nonvolatile optical memory element of the present invention, the semiconductor amplification region is caused to have a larger region where a photomagnetic effect more effectively occurs, when a voltage is applied between the electrode and the ferromagnetic body so that electrons that are spin-polarized according to a magnetization direction of the ferromagnetic body are injected from the ferromagnetic body into the semiconductor amplification region. A micro-sized ferromagnetic body in a single domain (single-magnetic structure) state is called a nanomagnet. The magnetization of the nanomagnet has two stable magnetization directions. In this invention, it is desirable that a size of the ferromagnetic body be 200 nm×200 nm or less.

The nonvolatile optical memory element of the present invention further includes an optical polarizer provided on an output side thereof. Further, the nonvolatile optical memory element of the present invention is arranged such that: the semiconductor amplification region includes three layers of an n-type semiconductor, an i-type semiconductor, and a p-type semiconductor; the ferromagnetic body is connected to an n-type semiconductor side of the semiconductor amplification region; and the electrode is connected to a p-type semiconductor side of the semiconductor amplification region. Moreover, in the nonvolatile optical memory element of the present invention, the ferromagnetic body is made of ferromagnetic metal, and the ferromagnetic body has two stable magnetization directions so that data is recorded according to which direction of the two stable magnetization directions the ferromagnetic body is magnetized along.

A method of the present invention is a method for reading data stored in the nonvolatile optical memory element, and includes the steps of: applying an electrical pulse between the electrode and the ferromagnetic body; supplying an optical pulse into the semiconductor amplification region via the optical waveguide; and reading intensity of the optical pulse outputted at an output side of the nonvolatile optical memory element. In the method of the present invention, timings of the electrical pulse and the optical pulse are adjusted so that the timing of the optical pulse delays from the timing of the electrical pulse, and the delay is shorter than a relaxation time of spin polarization in the semiconductor amplification region. In the method of the present invention, polarization of the optical pulse rotates according to a magnetization direction of the ferromagnetic body. Further, in the method of the present invention, the optical pulse is linearly polarized light; and when the optical pulse passes through the semiconductor amplification region, a polarization direction of the optical pulse rotates according to which direction of two opposite magnetization directions the ferromagnetic body is magnetized along. In the method of the present invention, the intensity of the light that has passed through an optical polarizer of the nonvolatile optical memory element and has been outputted at the output side of the nonvolatile optical memory element corresponds to a magnetization direction of the ferromagnetic body.

A memory device of the present invention includes: a plurality of the nonvolatile optical memory elements; an optical pulse source; and optical waveguides. In the memory device of the present invention, each of the optical waveguides connects its corresponding nonvolatile optical memory element to the optical pulse source, optical path lengths of the optical waveguides are adjusted so that one optical pulse, after passing through different memory cells, reaches an output side of the memory device with different optical delays, and the optical waveguides are combined at the output side of the memory device.

A method of the present invention is a method for reading data from a memory device including a plurality of the nonvolatile optical memory elements, an optical pulse source, and optical waveguides, and the method includes the steps of: applying an electrical pulse to all the plurality of the nonvolatile optical memory elements; supplying an optical pulse to all the plurality of the nonvolatile optical memory elements; and reading intensity of a consecutive optical pulse train. In the method of the present invention, intensity of each optical pulse included in the optical pulse train corresponds to data stored in a corresponding nonvolatile optical memory element.

The present invention is not limited to the description of the embodiments above, but may be altered by a skilled person within the scope of the claims. An embodiment based on a proper combination of technical means disclosed in different embodiments is encompassed in the technical scope of the present invention.

Reference Signs List
1, 41 Ferromagnetic Body
2 Semiconductor Photodetector
3, 43 Semiconductor Optical Amplifier
4 Optical Waveguide
9 Electrode
42 Buffer Layer
44 Optical Waveguide Core Layer
45 Optical Waveguide Buffer Layer
46 Substrate

We claim:

1. A nonvolatile optical memory element comprising:
an optical waveguide;
a semiconductor amplification region that is connected to the optical waveguide;
a ferromagnetic body having a single-magnetic structure, the ferromagnetic body being provided on one side of the semiconductor amplification region; and
an electrode provided on another side of the semiconductor amplification region which side is opposite to the side of the semiconductor amplification region on which the ferromagnetic body is provided, such that the semiconductor amplification region is sandwiched between the electrode and the ferromagnetic body,
the semiconductor amplification region being caused to have a larger region where a photomagnetic effect more effectively occurs, when a voltage is applied between the electrode and the ferromagnetic body so that electrons that are spin-polarized according to a magnetization direction of the ferromagnetic body are injected from the ferromagnetic body into the semiconductor amplification region.

2. The nonvolatile optical memory element as set forth in claim 1, wherein:
the semiconductor amplification region includes three layers of an n-type semiconductor, an i-type semiconductor, and a p-type semiconductor;
the ferromagnetic body is disposed on an n-type semiconductor side of the semiconductor amplification region; and
the electrode is disposed on a p-type semiconductor side of the semiconductor amplification region.

3. The nonvolatile optical memory element as set forth in claim 1, wherein:
the ferromagnetic body is made of ferromagnetic metal; and
the ferromagnetic body has two stable magnetization directions so that data is recorded according to which direction of the two stable magnetization directions the ferromagnetic body is magnetized along.

4. A method for reading data stored in a nonvolatile optical memory element as set forth in claim 1, comprising the steps of:
applying an electrical pulse between the electrode of the nonvolatile optical memory element and the ferromagnetic body of the nonvolatile optical memory element;
supplying an optical pulse into the semiconductor amplification region of the nonvolatile optical memory element via the optical waveguide of the nonvolatile optical memory element; and
reading intensity of the optical pulse outputted at an output side of the nonvolatile optical memory element.

5. The method as set forth in claim 4, wherein:
timings of the electrical pulse and the optical pulse are adjusted so that the timing of the optical pulse delays from the timing of the electrical pulse; and
the delay is shorter than a relaxation time of spin polarization in the semiconductor amplification region.

6. The method as set forth in claim 4, wherein:
the optical pulse is linearly polarized light; and
when the optical pulse passes through the semiconductor amplification region, a polarization direction of the optical pulse rotates according to which direction of two opposite magnetization directions the ferromagnetic body is magnetized along.

7. The method as set forth in claim 4, wherein:
the intensity of the light that has passed through an optical polarizer of the nonvolatile optical memory element and has been outputted at the output side of the nonvolatile optical memory element corresponds to a magnetization direction of the ferromagnetic body.

8. A memory device comprising:
a plurality of nonvolatile optical memory elements as set forth in claim 1;
an optical pulse source; and
optical waveguides.

9. The memory device as set forth in claim 8, wherein:
each of the optical waveguides connects its corresponding nonvolatile optical memory element to the optical pulse source;
optical path lengths of the optical waveguides are adjusted so that one optical pulse, after passing through different memory element cells, reaches an output side of the memory device with different optical delays; and
the optical waveguides are combined at the output side of the memory device.

10. A method for reading data from a memory device including a plurality of nonvolatile optical memory elements as set forth in claim 1, an optical pulse source, and optical waveguides, said method comprising the steps of:
applying an electrical pulse to all the plurality of nonvolatile optical memory elements;
supplying an optical pulse to all the plurality of nonvolatile optical memory elements; and
reading intensity of a consecutive optical pulse train.

\* \* \* \* \*